US008255783B2

(12) United States Patent
Kim

(10) Patent No.: US 8,255,783 B2
(45) Date of Patent: Aug. 28, 2012

(54) APPARATUS, SYSTEM AND METHOD FOR PROVIDING ERROR PROTECTION FOR DATA-MASKING BITS

(75) Inventor: Kyu-hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 1162 days.

(21) Appl. No.: 12/107,908

(22) Filed: Apr. 23, 2008

(65) Prior Publication Data

US 2009/0327800 A1    Dec. 31, 2009

(51) Int. Cl.
*G06F 11/00* (2006.01)

(52) U.S. Cl. ........................................ 714/811; 714/805

(58) Field of Classification Search .................. 714/801, 714/805, 811
See application file for complete search history.

(56) References Cited

U.S. PATENT DOCUMENTS

| 4,159,538 A | 6/1979 | Motsch |
| 5,040,152 A | 8/1991 | Voss et al. |
| 5,249,160 A | 9/1993 | Wu et al. |
| 5,513,135 A | 4/1996 | Dell et al. |
| 5,893,136 A | 4/1999 | Stolt et al. |
| 5,900,887 A | 5/1999 | Leung et al. |
| 6,009,026 A | 12/1999 | Tamlyn et al. |
| 6,104,417 A * | 8/2000 | Nielsen et al. ............... 345/542 |
| 6,229,727 B1 | 5/2001 | Doyle |
| 6,272,053 B1 | 8/2001 | Choi |
| 6,381,685 B2 | 4/2002 | Dell et al. |
| 6,711,067 B1 | 3/2004 | Kablanian |
| 7,221,615 B2 | 5/2007 | Wallner et al. |
| 7,458,004 B2 * | 11/2008 | Takahashi ................. 714/763 |
| 7,774,684 B2 * | 8/2010 | Bains ......................... 714/766 |
| 7,844,888 B2 * | 11/2010 | Nygren et al. ............... 714/805 |
| 2007/0016843 A1 * | 1/2007 | Griseta et al. ............... 714/805 |
| 2007/0076508 A1 * | 4/2007 | Wallner et al. ............ 365/230.03 |

FOREIGN PATENT DOCUMENTS

JP    54136140    10/1979

OTHER PUBLICATIONS

JE Ackerman, Dram Page-Mode to Perform Read-Modify-Write, IBM TDB v37 n5, 05-94, pp. 17-18, May 1994.

* cited by examiner

*Primary Examiner* — Joshua Lohn
(74) *Attorney, Agent, or Firm* — Cantor Colburn LLP; William A. Kinnaman, Jr.

(57) ABSTRACT

An apparatus, system, and method for providing error protection for data-masking bits in a memory device of a memory system are provided. The memory device includes a memory core to store data, and a data interface to receive the data and data-masking bits associated with a write command. The memory device also includes a gating block to control writing the data to the memory core, where the writing of the data to the memory core is inhibited upon detecting an error with one or more of the data-masking bits.

17 Claims, 10 Drawing Sheets

APPARATUS, SYSTEM AND METHOD FOR PROVIDING ERROR PROTECTION FOR DATA-MASKING BITS

BACKGROUND OF THE INVENTION

This invention relates generally to computer memory, and more particularly to providing error protection for data-masking bits in a memory system.

Data masking is a technique to allow or block access to one or more locations in a memory device when issuing a read or write command to the memory device. For example, if a memory device has a data bus width of 8 bits (1 byte) and a burst length of 8 bytes per burst, a data mask can be used when issuing a write command burst to the memory device so fewer than 8 bytes are written as part of the burst.

To enhance reliability in a memory system, error detection can be employed. Error detection may be used to detect data errors and initiate a retry of a failed operation to protect against input/output (I/O) errors in a high-speed memory interface channel. For example, a parity bit can be used in conjunction with data received on data pins at a memory device to confirm that even or odd parity is maintained on read or write commands. If an error is detected, e.g., a data bit changed state due to a temporary error condition; a retry of the operation may fix the problem. However, when an error occurs for data-masking bits, the result can be a write of data to an unintended location, for instance, a location that should have been masked is overwritten. Therefore, even though the error may be detected, simply retrying the errant operation will not fix the problem when the errant data mask results in modifying unintended locations. A successful retry does not fix locations that were polluted by the error condition. The polluted data is not recovered because the write operation (without any error) masks writing to the polluted locations.

It would be beneficial to develop an approach to modify a memory system to perform error detection on data-masking bits, preventing errant data mask values from being used to modify data values in memory. Writing data-masking bits on data pins rather than dedicated data mask pins can reduce memory device pin count, but error protection schemes must be modified to account for a potential error occurring while sending data-masking bits to the memory device on the data pins. Accordingly, there is a need in the art for providing error protection for data-masking bits in a memory system.

BRIEF SUMMARY OF THE INVENTION

An exemplary embodiment is a memory device including a memory core to store data, and a data interface to receive the data and data-masking bits associated with a write command. The memory device also includes a gating block to control writing the data to the memory core, where the writing of the data to the memory core is inhibited upon detecting an error with one or more of the data-masking bits.

Another exemplary embodiment is a memory system including a memory device and a memory device interface. The memory device includes a memory core to store data, and a data interface to receive the data and data-masking bits associated with a write command. The memory device also includes a gating block to control writing the data to the memory core, wherein the writing of the data to the memory core is inhibited upon detecting an error with one or more of the data-masking bits. The memory device interface includes a data mask controller to output the data and the data-masking bits associated with the write command to the data interface of the memory device.

A further exemplary embodiment is a method for providing error protection for data-masking bits in a memory device of a memory system. The method includes receiving a write command including data and data-masking bits associated with the write command on a data interface of the memory device. The method further includes inhibiting writing the data to a memory core of the memory device upon detecting an error with one or more of the data-masking bits.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Figure 1:
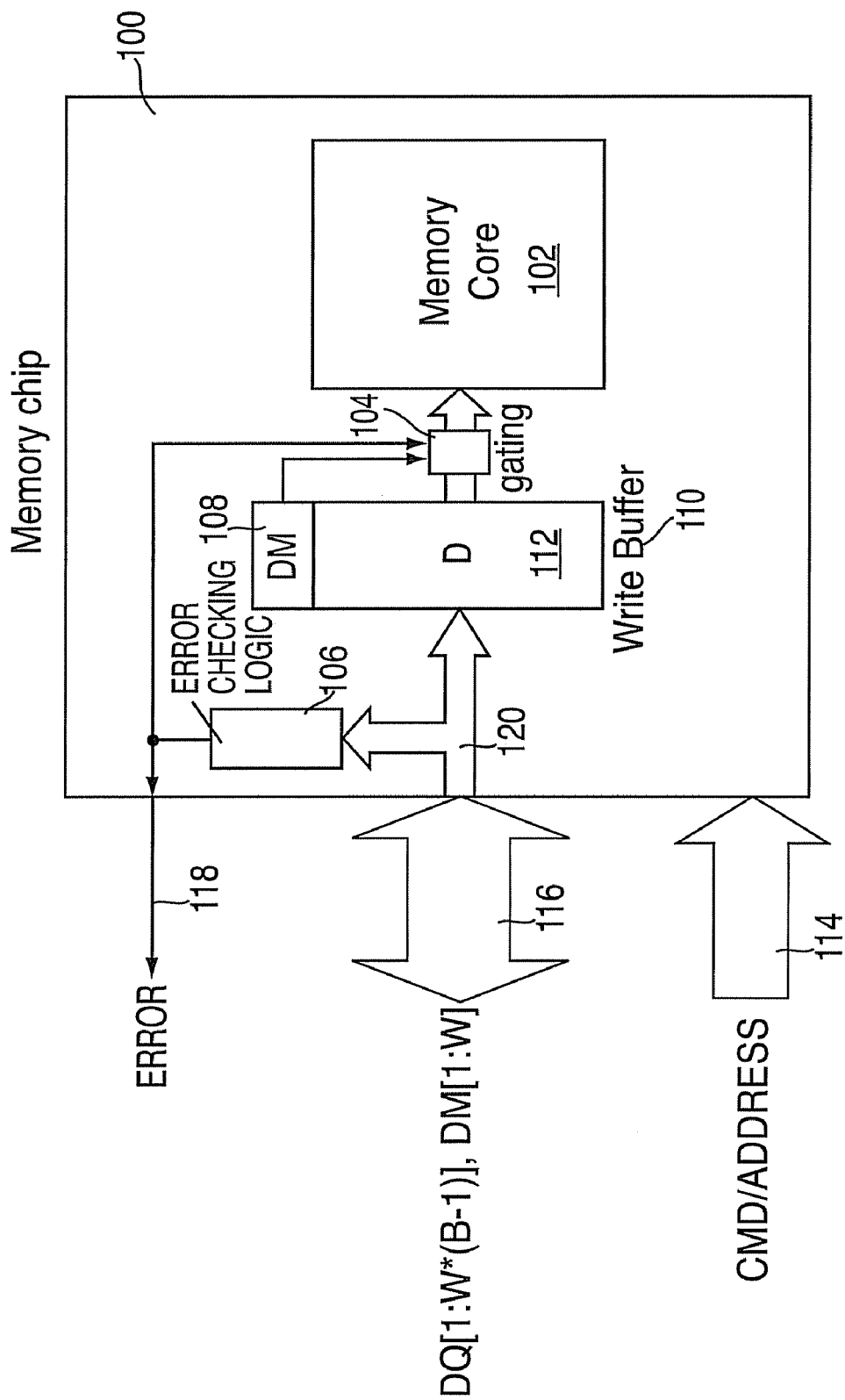
FIG. 1 depicts an example of a memory chip that may be implemented by exemplary embodiments.

The invention as described herein provides error protection for data-masking bits in a memory system. To save pin count on a memory device (e.g., a memory chip), data-masking bits can be sent through data pins rather than using one or more dedicated data masking pins on the memory device. The term "pin" as used herein can refer to a single connection or a combination of connections (e.g., differential signaling) to convey information to a memory device, and inherently includes a variety of packaging and connection technologies, such as balls, columns and other such contacts. Data pins are also referred to herein as a "data interface". The data-masking bits are used to prevent at least one memory location from being written as part of a burst write operation. For instance, a previously unused pin (e.g., an unused address pin) on the memory device may be asserted during a burst write of eight bytes to the memory device, indicating that the last byte (byte 7) holds data masking information and bytes 0 up to byte 6 hold data to be written. Each bit in the data-masking byte can be mapped to a byte position in the burst to inform the memory device which byte positions contain data. Thus, if bit positions zero and two are set in the data-masking byte, received as byte 7 of an 8-byte transfer (bytes numbered 0 to 7), the memory device can interpret the received bytes as illustrated in the following table:

TABLE 1

Example Burst Write Mapping

| Burst Byte Position | Mapping |
| --- | --- |
| 0 | Data Byte 1 |
| 1 | Data Byte 3 |
| 2 | Data Byte 4 |
| 3 | Data Byte 5 |
| 4 | Data Byte 6 |
| 5 | Data Byte 7 |
| 6 | Don't Care |
| 7 | Data-masking byte (Value = 00000101b) |

Thus it can be seen that the mapping of particular data byte positions can change dynamically as a function of the data-masking byte value, with the data-masking byte located in a predetermined position in the burst. In alternate embodiments, the relative numbering of burst byte position to data-masking byte position is rearranged. For example, the data-masking byte can be at burst byte position zero rather than seven. Any "don't care" values that are masked from being written to the memory device can also be rearranged relative to the above example. It will be understood that the reference to 8-bit bytes represents one example, as any width may be supported, such as 16-bit words, 32-bit words, 64-bit words, and the like. The address of the data bytes can be determined based on address values received on address lines at the memory device. Error detection is employed to prevent writing/masking data bytes incorrectly.

In an exemplary embodiment, a memory chip includes a write buffer to hold write data while performing an error check upon the write data, confirming no transmission error. The error checking and temporary storage in the write buffer provides protection for both data values and data-masking values received on data pins of the memory chip. If no error is detected, the temporarily stored data is transferred from the write buffer into the memory core.

In an alternate embodiment, each data-masking (DM) bit is transferred using an extended bit time (e.g., two or more bit intervals) so that the memory chip can sample each DM bit at least twice. This can be implemented by sending each DM bit twice in the same burst, providing at least a redundant pair of each DM bit in the same burst. The memory chip may conclude that there is no error if the two or more sampled DM bit values are equal. If not, it concludes that there was an error and does not write anything to the memory core. The detected error is reported to a memory controller that initiated the write operation. The memory controller can then retry the write operation in response to receiving an indication of the error.

Error checking may be performed using cyclic redundancy checks (CRCs), parity bits, error correcting codes (ECCs), error detection and correction codes (EDACs), or other error detection schemes known in the art. Further details regarding the invention are provided herein.

Turning now to the figures, it will be seen that FIG. 1 depicts a memory chip 100 as an example of an apparatus for practicing the invention, which includes a memory core 102 for storing data. The memory core 102 may include transistors and/or capacitors to store data. A gating block 104 is used to control when a write operation to the memory core 102 is allowed to proceed. In an exemplary embodiment, the gating block 104 receives input from both error checking logic 106 and a data-masking segment 108 of a write buffer 110. The write buffer 110 also includes a data segment 112 that may hold multiple data values received during a write command burst. Referring back to the example of Table 1, the data segment 112 would hold all of the data bytes (data byte 1 and 3-7) while the data-masking segment 108 would hold the data-masking byte.

The memory chip 100 may interface with a hub device or a memory controller to send commands and addresses via command/address bus 114, data and data-masking bits via data bus 116, and error information on error bus 118. Each of the command/address bus 114, data bus 116 and error bus 118 can include one or more line connected to pins of the memory chip 100. The command/address bus 114 may include a read or write command, one or more clock signals, and address signals associated with the read or write command. The data bus 116 can include multiple data (DQ) signals for reading and writing data, as well as data-masking (DM) signals to control which locations in the memory core 102 should be written. An internal data bus 120 acts as a data interface routing signals from the data bus 116 to both the error checking logic 106 and the write buffer 110, which enables error checking on all signals received via the data bus 116, including any DM signals.

Figure 2:
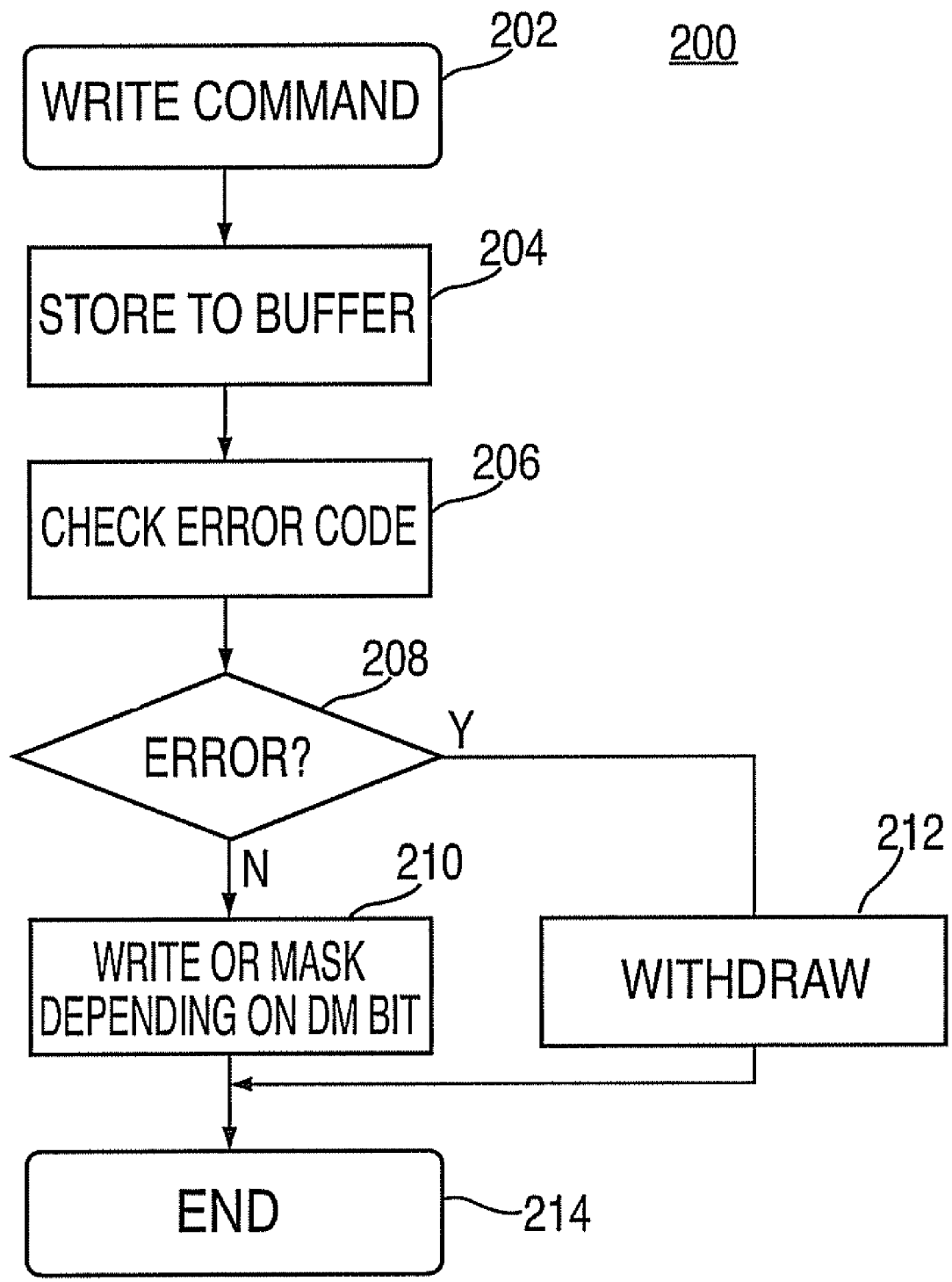
FIG. 2 depicts an exemplary process for writing to the memory chip of FIG. 1 that may be implemented by exemplary embodiments.

FIG. 2 depicts a process 200 for writing data to the memory chip 100 of FIG. 1 that may be implemented by an exemplary embodiment. The process 200 is implemented in the memory chip 100 to verify the integrity of data received on the data bus 116 of FIG. 1 prior to committing the data issued by a memory interface device, such as a memory controller or a hub device, to the memory core 102. At block 202, a check is performed to determine whether a write command has been received at the memory chip 100. The write command can be part of a burst of both data and data-masking values. At block 204, when the write command is received, data and data-masking bits are stored the data section 112 and data-masking section 108 of the write buffer 110. At block 206, an error code, such as a CRC, is calculated and checked using the error checking logic 106 for data or data-masking bits received at the internal data bus 120 via the data bus 116. In an exemplary embodiment, an expected error code is communicated to the memory chip 100 for comparison against the error code calculated using the error checking logic 106.

At block 208, a determination is made as to whether an error occurred on the data (including data-masking bits) received via the data bus 116 based on the error code check of block 206. If no error is detected, then the gating block 104 allows the data held in the data section 112 of the write buffer 110 to be written to the memory core 102 depending upon whether any bits are asserted in the data-masking section 108 of the write buffer 110. For example, if no error is detected and no data-masking bits are set in the data-masking section 108, then all of the data in the data section 112 can be written to the memory core 102 using address and command information from the command/address bus 114. However, if there is no error and one or more data-masking bits are set in the data-masking section 108, then data bytes corresponding to the asserted data-masking bits are blocked from being written to the memory core 102 using the gating block 104. As previously described, each bit in the data-masking section 108 may correspond to a particular byte in the data section 112, e.g., first DM bit maps to first DQ byte, second DM bit maps to second DQ byte, and so forth. At block 212, if an error was detected at block 208 as a result of errant data or errant data-masking bits, then the attempted write is withdrawn. The gating block 104 inhibits both errant data and errant data-masking bits from polluting the memory core 102. The process 200 terminates at block 214.

Figure 3:
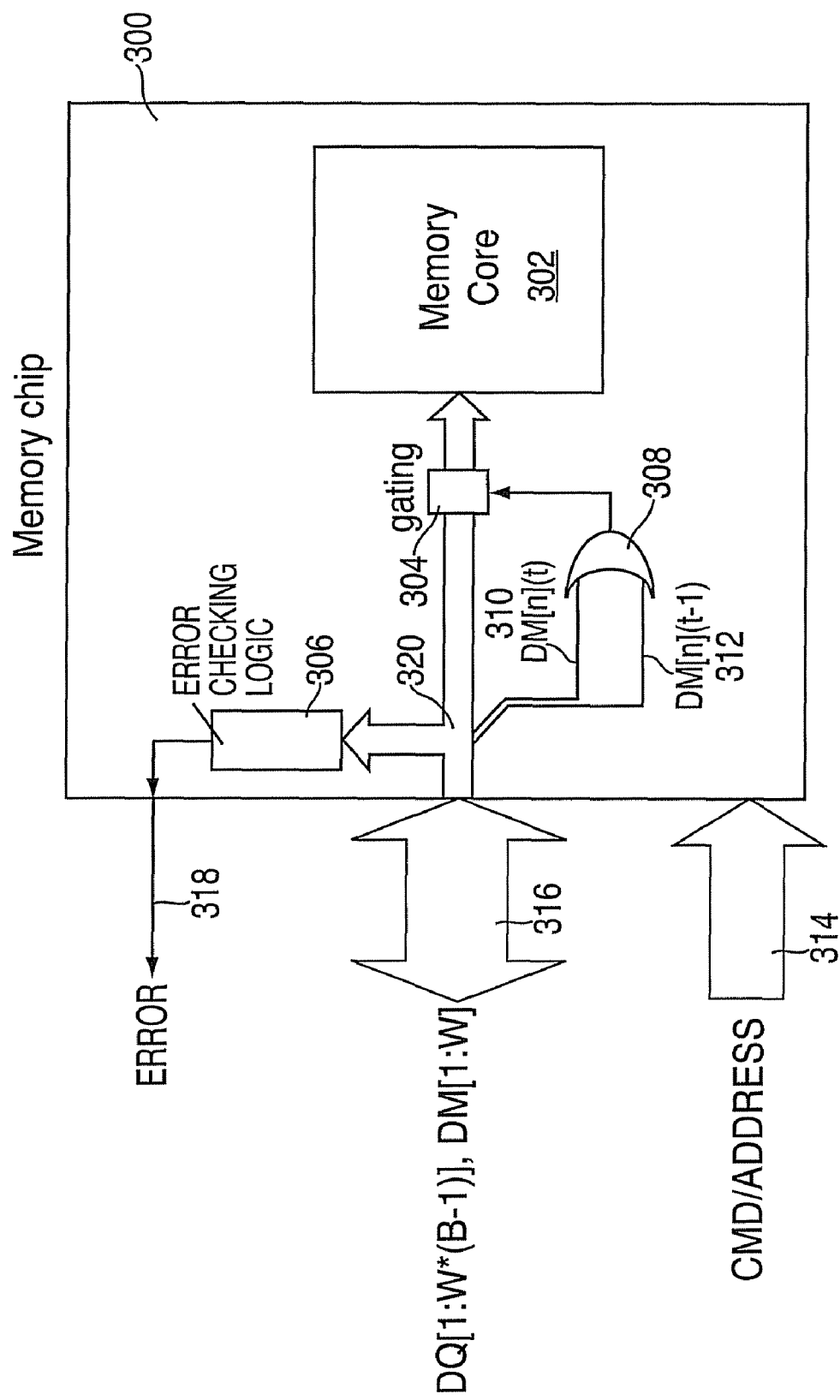
FIG. 3 depicts an example of a memory chip capable of receiving data-masking bits through a data interface during multiple unit intervals that may be implemented by exemplary embodiments.

FIG. 3 depicts a memory chip 300 for transferring data-masking bits through data pins during multiple unit intervals as an example of an apparatus for practicing the invention. Similar to the memory chip 100 of FIG. 1, the memory chip 300 includes a memory core 302 for storing data. The memory core 302 may include transistors and/or capacitors to store data. A gating block 304 is used to control when a write operation to the memory core 302 is allowed to proceed. In contrast to the gating block 104 of FIG. 1, the gating block 304 receives input from comparison block 308 without regard to the state of error checking logic 306. If the error checking logic 306 detects an error on data received at the memory chip, it notifies the originating memory interface device of the error (e.g., a memory controller or memory hub), which will subsequently reattempt the operation. Since an error detected in the data received at the memory chip 300 will result in the data being retransmitted to the memory chip 300, the gating block 304 only needs to inhibit writes to the memory core 302 that may cause unintended locations to be modified (e.g., writing to a location that should have been masked). In an exemplary embodiment, the data-masking bits received at the memory chip 300 have an extended length of more than one bit interval so that multiple samples of the data-masking bits can be acquired and compared by the comparison block 308.

The comparison block 308 may function as an OR-gate to compare the samples of the data-masking bits. For example, if the data-masking bits are extended to a double bit interval, then two samples can be acquired for each data-masking bit. In comparing the two samples for a common data-masking bit (DM[n](t) 310 and DM[n](t−1) 312), if either DM[n](t) 310 or DM[n](t−1) 312 is set then the gating block 304 prevents the data byte associated with the common data-masking bit from being written to the memory core 302. If only one of the common data-masking bits DM[n](t) 310 and DM[n](t−1) 312 is set, this indicates an error condition, as an unexpected state change occurred. If both of the common data-masking bits are set, this indicates an intentional data-masking request associated with a write command. Thus, in either case, the associated data should not be written to the memory core 302. This is further illustrated in the following table:

TABLE 2

Multiple Data-Masking Bits Per Burst

| DM[n](t) 310 | DM[n](t − 1) 312 | Result |
| --- | --- | --- |
| 0 | 0 | Allow Write |
| 0 | 1 | Error - Inhibit Write |
| 1 | 0 | Error - Inhibit Write |
| 1 | 1 | Mask - Inhibit Write |

Figure 10:
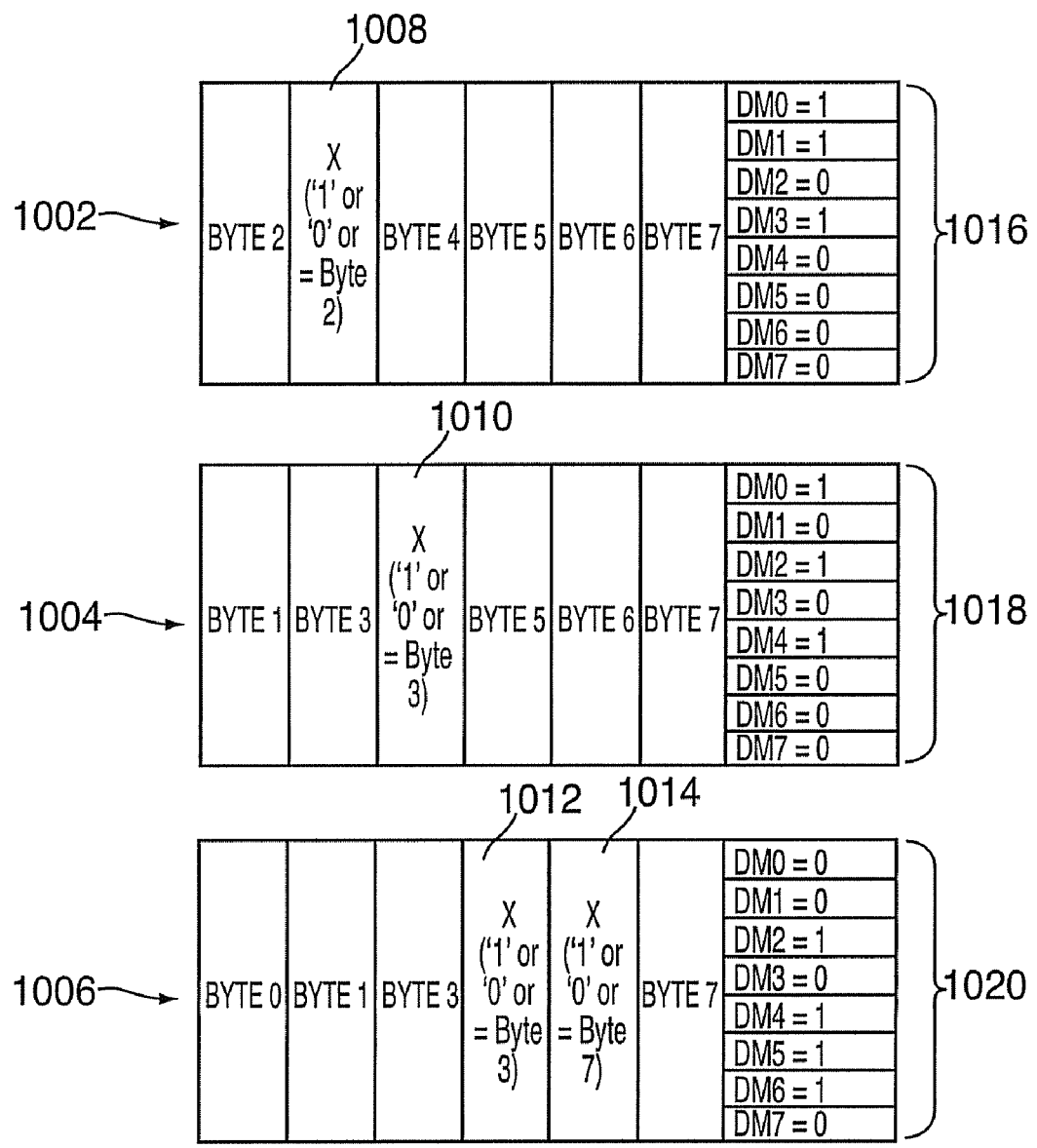
FIG. 10 depicts an example of byte positioning with multiple masked bytes in bursts of data in accordance with an exemplary embodiment.

The extended length of the data-masking bits can be achieved using two data-masking bytes per burst. For example, with a burst length of eight, so long as at least two bytes will be masked, then two data-masking bytes can be included in the burst at burst byte positions 6 and 7, with data at burst byte positions 0-5. Alternatively, the data-masking bytes can be located in anywhere within the burst, including non-consecutive positions. When more than two bytes are masked, the bytes in the burst may be relocated in sequential order except first two masked bytes. Additional masked bytes beyond two can be "don't care" values, e.g., 0's, 1's or a redundant byte value. An example of this is depicted in FIG. 10 where burst sequences 1002, 1004 and 1006 include three or more masked bytes (where bytes 1008, 1010, 1012 and 1014 represent the third or forth masked byte) as identified by data-masking bits 1016, 1018 and 1020.

The memory chip 300 may interface with a hub device or a memory controller to send commands and addresses via command/address bus 314, data and data-masking bits via data bus 316, and error information on error bus 318. Each of the command/address bus 314, data bus 316 and error bus 318 can include one or more line. The command/address bus 314 may include signals indicating a read or write command, one or more clock signals, and address signals associated with the read or write command. The data bus 316 can include multiple data (DQ) signals for reading and writing data, as well as data masking (DM) signals to control which locations in the memory core 302 are blocked. An internal data bus 320 acts as a data interface routing signals from the data bus 316 to the error checking logic 306, the gating block 304 and the comparison block 308.

Figure 4:
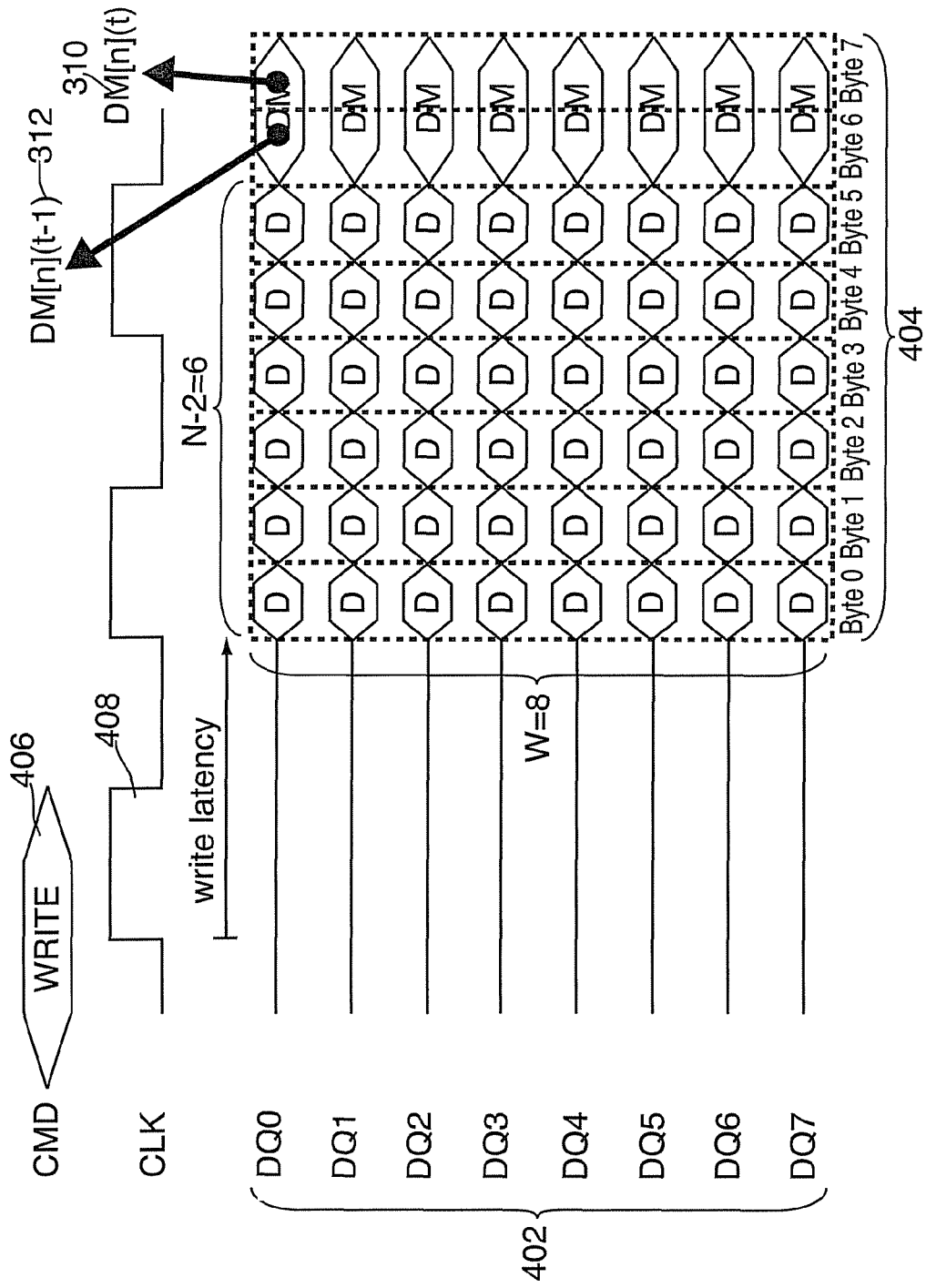
FIG. 4 depicts an exemplary timing associated with the memory chip of FIG. 3 for transferring data-masking bits through a data interface during multiple unit intervals that may be implemented by exemplary embodiments.

FIG. 4 depicts an exemplary timing diagram associated with the memory chip 300 of FIG. 3 for transferring data-masking bits through a data interface during multiple unit intervals. In an exemplary embodiment, DQ0-7 402 are data pins of the data interface sending data to a memory device (e.g., data bus 316 sends data to the memory chip of FIG. 3 via the internal data bus 320) in a burst 404 of 8 bytes per pin. A write command 406 precedes the burst 404 and a clock 408 provides timing for the memory device to sample the data pins DQ0-7 402. In the example depicted in FIG. 4, the first six byte positions (byte 0 to byte 5) are reserved for data and the final two byte positions (bytes 6 and 7) are data-masking bytes. The data-masking bytes are extracted from the burst 404 as DM[n](t) 310 and DM[n](t−1) 312 for input to the comparison block 308 of FIG. 3 to control the gating block 304 of FIG. 3. Although the relative timing between bytes of the burst 404 to clock 408 is a 4-to-1 ratio, it will be understood that this is merely one embodiment and not limiting in scope, as alternate timing relationships can be implemented within the scope of the invention.

Figure 5:
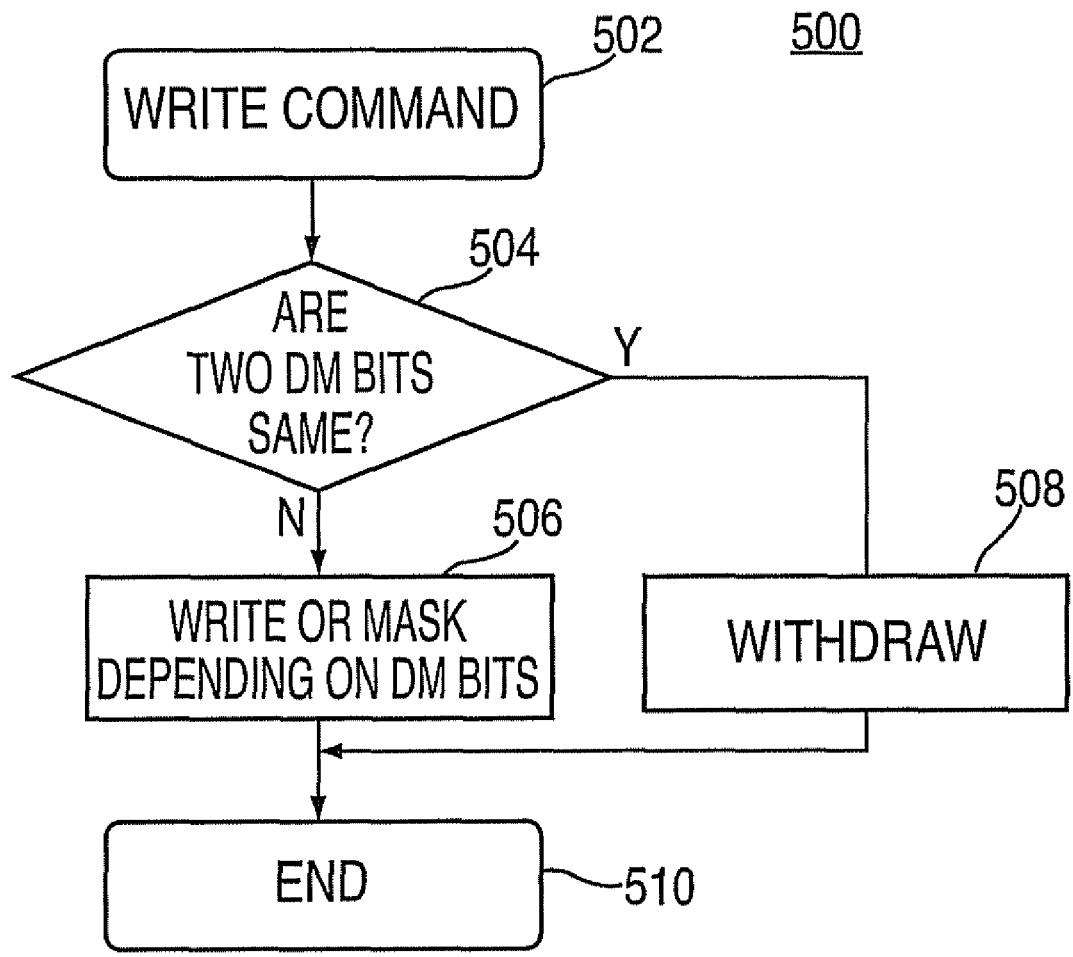
FIG. 5 depicts an exemplary process for writing to the memory chip of FIG. 3 that may be implemented by exemplary embodiments.

FIG. 5 depicts a process 500 for writing data to the memory chip 300 of FIG. 3 that may be implemented by an exemplary embodiment. The process 500 is implemented in the memory chip 300 to verify the integrity of data received on the internal data bus 320 of FIG. 3 from the data bus 316 prior to committing the data issued by a memory interface device, such as a memory controller or a hub device, the memory core 302. At block 502, a check is performed to determine whether a write command has been received at the memory chip 300. At block 504, when a write command is received, a check is performed to determine whether two data-masking bits are the same value, e.g., each pair of DM[n](t) 310 and DM[n](t−1) 312 values can be examined. If no mismatch is detected, then the gating block 304 may allow the associated write to proceed to the memory core 302 depending upon whether the pair of data-masking bits is asserted or clear. For example, if neither DM[n](t) 310 nor DM[n](t−1) 312 is asserted, data can be written to the memory core 302 using address and command information from the command/address bus 314. However, if there is DM[n](t) 310 and DM[n](t−1) 312 are asserted for any pair, then data bytes corresponding to the asserted data-masking bits are inhibited from being written to the memory core 302. At block 508, if a mismatch was detected at block 504, then the attempted write is withdrawn preventing pollution of the memory core 302. The process 500 terminates at block 510.

Figure 6:
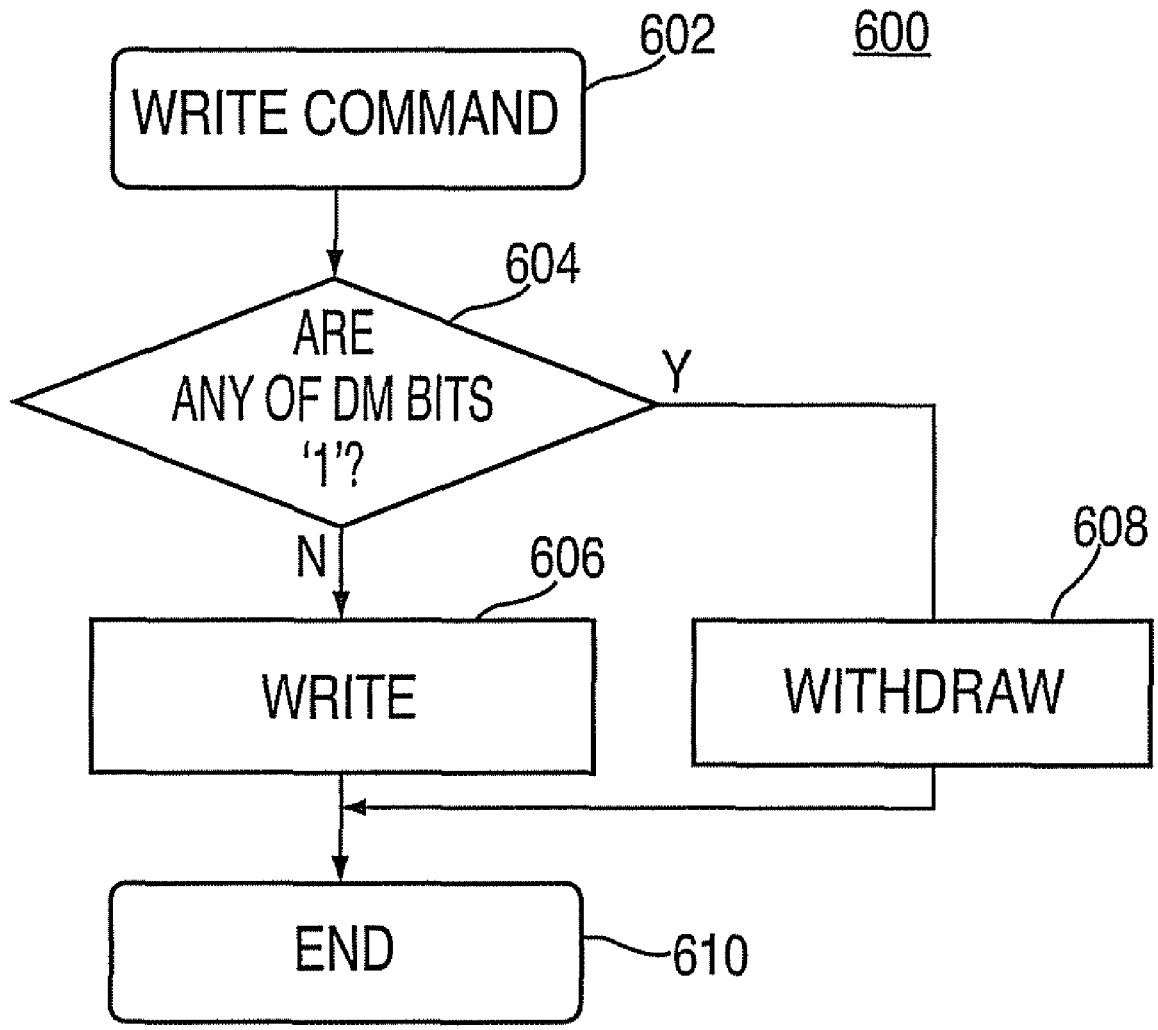
FIG. 6 depicts an alternate process for writing to the memory chip of FIG. 3 that may be implemented by exemplary embodiments.

FIG. 6 depicts an alternate process 600 for writing data to the memory chip 300 of FIG. 3 that may be implemented by an exemplary embodiment. Similar to the process 500 of FIG. 5, the process 600 may be implemented in memory devices to delay commands issued by a memory interface device such as a memory controller or a hub device. At block 602, a check is performed to determine whether a write command has been received at the memory chip 300. Once the write command is received, a check is performed at block 604 to determine whether any of the DM bits are set to a value of '1', e.g., all of the DM[n](t) 310 and DM[n](t−1) 312 values can be examined. Block 604 avoids examining each DM bit pair for consistency and instead checks for assertion of any DM bit in each DM pair. This approach takes advantage of the results illustrated by previously described Table 2, where either or both DM[n](t) 310 and DM[n](t−1) 312 being asserted leads to the outcome of inhibiting a write to the memory core 302 (i.e., an error or valid masking request). At block 606 the data is written to the memory core 302 using address and command information from the command/address bus 314. At block 608, if assertion of either or both DM[n](t) 310 and DM[n](t−1) 312 was detected at block 604, then the attempted write is withdrawn preventing pollution of the memory core 302. The process 600 terminates at block 610.

Figure 7:
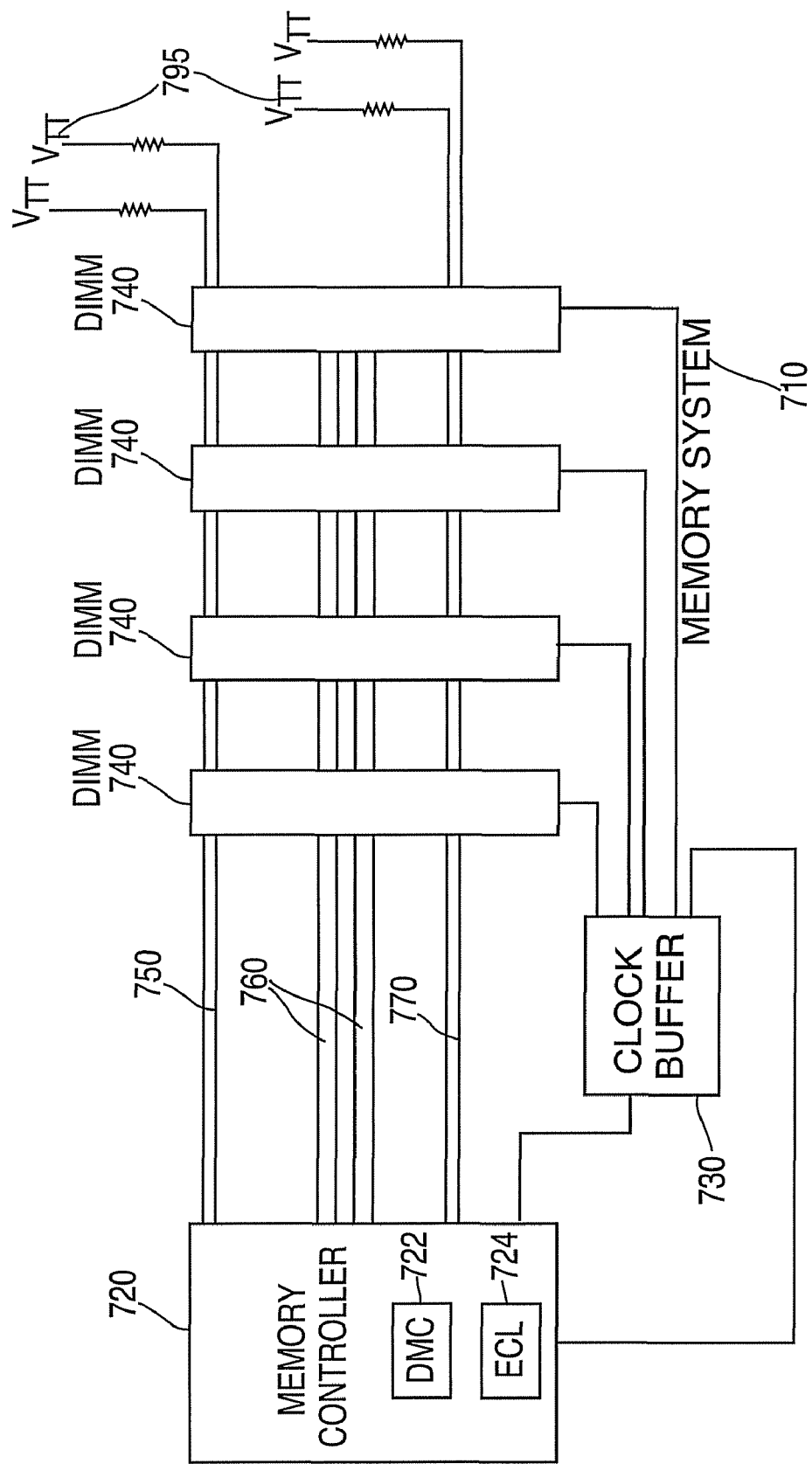
FIG. 7 depicts a memory system that includes DIMMs on a traditional multi-drop stub bus providing error protection for data-masking bits that may be implemented by exemplary embodiments.

FIG. 7 depicts a simplified diagram and description of a memory system 710 that includes up to four dual in-line memory modules (DIMMs) 740 on a traditional multi-drop stub bus, which may implement error protection for data-masking bits. The system includes a memory controller 720, an external clock buffer 730, DIMMs 740, an address bus 750, a control bus 760 and a data bus 770 with terminators 795 on the address bus 750 and the data bus 770. The memory controller 720 is a memory interface device that includes the use of outputting data-masking bits on a data interface as described herein in reference to FIGS. 1-6. The data-masking bits on a data interface is supported in both the memory devices of the DIMMs 740 and the memory controller 720. For enhanced error protection, the memory devices of the DIMMs 740 may incorporate the processes 200 of FIG. 2, 500 of FIG. 5 or 600 of FIG. 6 depending on whether a single data-masking value or multiple data-masking values are supported per write burst.

The memory controller 720 includes data mask controller (DMC 722) and error checking logic (ECL) 724. The DMC 722 outputs data-masking values along with data values on data lines of the data bus 770. The DMC 722 can adjust bursting order to insert data-masking values in various positions within a burst operation, including multiple data-masking values per burst. In one embodiment, the DMC 722 notifies memory devices on the DIMMs 740 as to when one or more data-masking values are included in a burst via adjusting a value of a predetermined address bit on address bus 750. The ECL 724 can generate an error code, such as a parity value, CRC, ECC, or EDAC, to provide the DIMMs 740 with an expected value for error checking. The ECL 724 can also receive error signals from the DIMMs 740, where the error information can be sent on one or more of the data bus 770 or the control bus 760, and the memory controller 720 responds by retrying the errant command. The DMC 722 and/or the ECL 724 may be implemented by hardware and/or software.

Although only a single memory channel is shown in FIG. 7, systems produced with these modules often included more than one discrete memory channel from the memory controller, with each of the memory channels operated singly (when a single channel was populated with modules) or in parallel (when two or more channels where populated with modules) to achieve the desired system functionality and/or performance.

Figure 8:
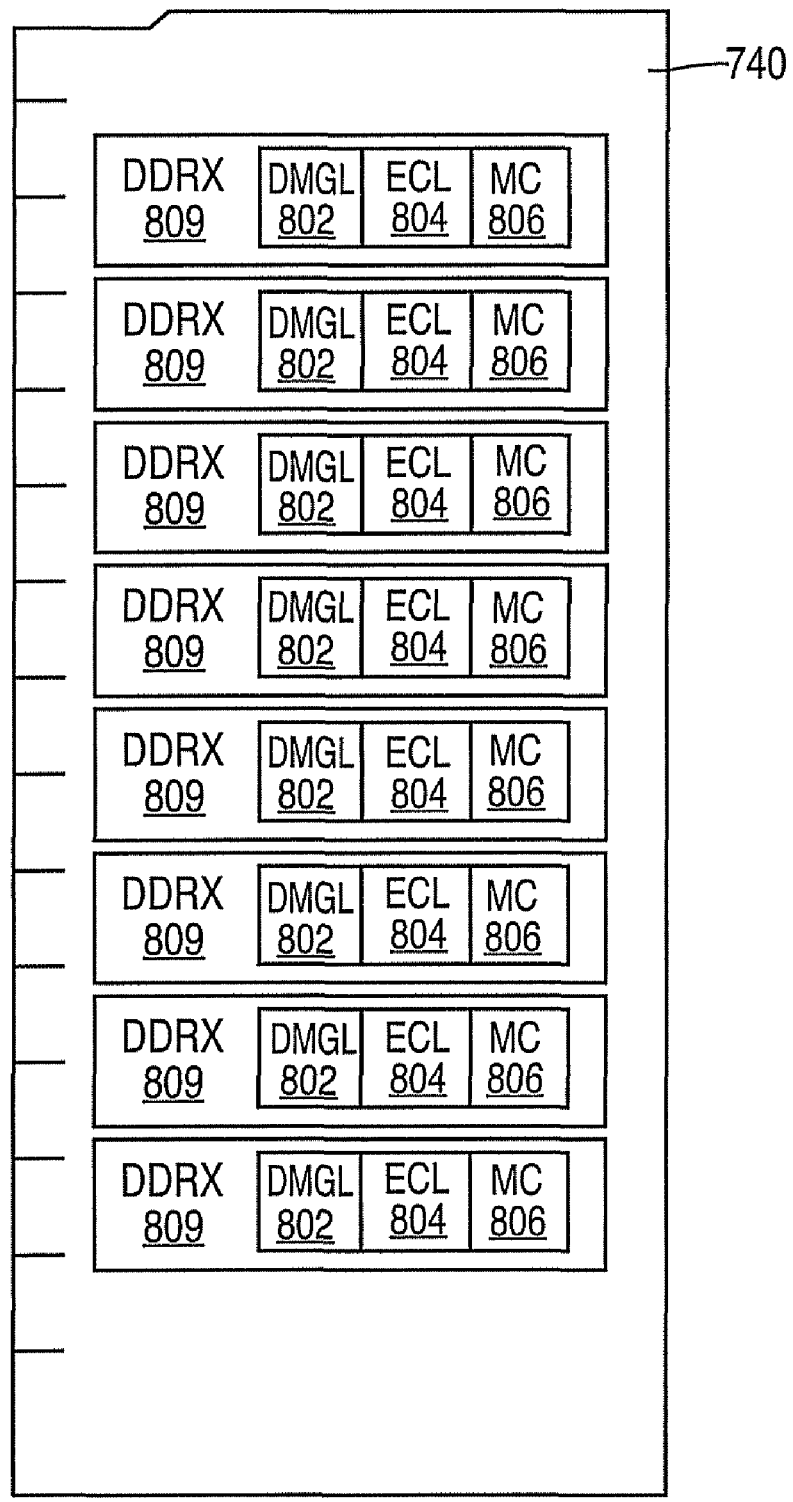
FIG. 8 depicts memory devices on a DIMM providing error protection for data-masking bits that may be implemented by exemplary embodiments.

FIG. 8 depicts memory devices on one of the DIMMs 740 of FIG. 7. In an exemplary embodiment, data mask and gating logic (DMGL) 802 and error code logic (ECL) 804 are included in each of the memory devices 809. The memory devices 809 may be DDR memory, such as DDR1 SDRAM, DDR2 SDRAM, DDR3 SDRAM, DDR4 SDRAM, and the like (depicted generically as DDRX). The DMGL 802 may represent a combination of the data-masking segment 108 in the write buffer 110 along with the bating block 104 of FIG. 1 or the comparison block 308 with the gating block 304 of FIG. 3. The DMGL 802 includes logic for timing and control (e.g., using processes 200, 500 or 600 of FIGS. 2, 5 and 6) that functions in conjunction with a memory interface device, such as the memory controller 720 of FIG. 7. The ECL 804 may be equivalent to the error checking logic 106 of FIG. 1 or the error checking logic 306 of FIG. 3. The ECL 804 handles determining specific error codes, e.g., a CRC, as well as notifying the memory interface device of the error. It will be understood that the DIMM 740 of FIG. 8 depicts merely an exemplary arrangement of memory devices providing error protection for data-masking bits. Other arrangements may include single in-line memory modules (SIMMs), ranked DIMMs, registered DIMMs, and other memory device organization formats known in the art.

Figure 9:
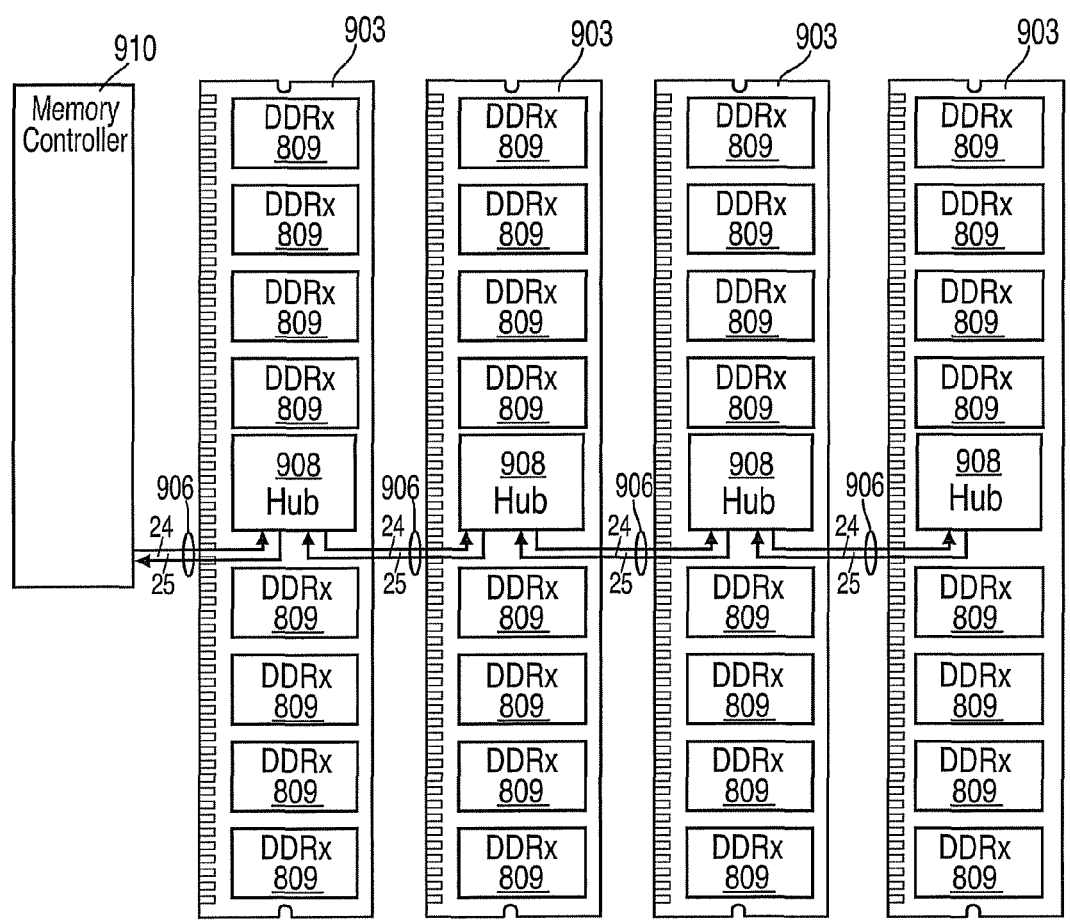
FIG. 9 depicts a cascade interconnect memory system with unidirectional busses providing error protection for data-masking bits that may be implemented by exemplary embodiments.

FIG. 9 depicts a memory structure with cascaded memory modules 903 and unidirectional busses 906. One of the functions provided by hub devices 908 in the memory modules 903 in the cascade structure is a re-drive function to send signals on the unidirectional busses 906 to other memory modules 903 or to the memory controller 910. FIG. 9 includes the memory controller 910 and four memory modules 903, on each of two memory busses 906 (a downstream memory bus with 24 wires and an upstream memory bus with 25 wires), connected to the memory controller 910 in either a direct or cascaded manner. The memory module 903 next to the memory controller 910 is connected to the memory controller 910 in a direct manner. The other memory modules 903 are connected to the memory controller 910 in a cascaded manner. Although not shown in this figure, the memory controller 910 may be integrated in a processor and may connect to more than one memory bus 906. As depicted in FIG. 9, the hub devices 908 are a type of memory interface device and may include the use of the DMC 722 and ECL 724 as described in reference to FIG. 7, which may be implemented by hardware and/or software.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Exemplary embodiments include a computing system with a processor(s) and an I/O unit(s) (e.g., requestors) interconnected to a memory system that contains a memory controller and memory devices. In exemplary embodiments, the memory system includes a processor or memory controller interfaced to a set of hub devices (also referred to as "hub chips"). The hub devices connect and interface to the memory devices via signals which include clock signals. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g., a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM, which is a small circuit board or substrate composed primarily of RAM integrated circuits or die on one or both sides and single row of pins along one long edge. DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor)

which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC, ECC, EDAC, parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include providing error protection for data-masking bits on a data interface at a memory device. A gating block prevents errant data-masking values from polluting the memory core of the memory device, which may not otherwise be remedied by simply retrying the failed operation.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A memory device comprising:
    a memory core configured to store data;
    a data interface configured to receive the data and data-masking bits associated with a write command; and
    a gating block configured to control writing the data to the memory core, wherein the writing of the data to the memory core is inhibited upon detecting an error with one or more of the data-masking bits, the writing of the data to the memory core proceeds responsive to the data-masking bits when no errors are detected in the data-masking bits, and the detecting the error with one or more of the data-masking bits is performed using a comparison block configured to compare at least two of the data-masking bits received in a burst operation.

2. The memory device of claim 1 further comprising:
    a write buffer, the write buffer comprising:
        a data segment configured to hold the data prior to writing the data to the memory core; and
        a data-masking segment configured to hold the data-masking bits, wherein the data-masking segment provides an input to the gating block to inhibit writing the data to the memory core in response to at least one of the data-masking bits being asserted.

3. The memory device of claim 1 wherein detecting the error with one or more of the data-masking bits is further performed using error checking logic that is configured to detect errors on values received at the data interface.

4. The memory device of claim 3 wherein the error checking logic utilizes a cyclic redundancy check (CRC) calculated on the values received at the data interface.

5. The memory device of claim 1 wherein the comparison block is further configured to trigger the gating block to inhibit writing the data to the memory core in response to a mismatch between the compared data-masking bits.

6. The memory device of claim 1 wherein the comparison block functions as a logical OR-gate to inhibit writing the data to the memory core when any of the compared data-masking bits are asserted.

7. A memory system comprising:
    a memory device comprising:
        a memory core configured to store data;
        a data interface configured to receive the data and data-masking bits associated with a write command, wherein the write command is a burst; and
        a gating block configured to control writing the data to the memory core, wherein the writing of the data to the memory core is inhibited upon detecting an error with one or more of the data-masking bits and the writing of the data to the memory core proceeds responsive to the data-masking bits when no errors are detected in the data-masking bits; and
    a memory device interface, comprising:
        a data mask controller configured to output the data and the data-masking bits associated with the write command to the data interface of the memory device, wherein the data mask controller alters the byte position of the data and the data-masking bits associated with the write command, placing the data-masking bits at a predetermined position in the burst.

8. The system of claim 7, wherein the data mask controller is further configured to insert at least a pair of redundant data-masking bits in the burst.

9. The system of claim 7, wherein the memory device is incorporated on a dual in-line memory module (DIMM).

10. The system of claim 9 wherein the memory device interface is a hub on the DIMM and the hub is cascade interconnected to a memory controller.

11. The system of claim 7 wherein the memory device interface further comprises error checking logic configured to receive an indication of the error with one or more of the data-masking bits from the memory device.

12. The system of claim 11 wherein the memory device interface is further configured to resend the write command to the memory device in response to receiving the indication of the error.

13. A method for providing error protection for data-masking bits in a memory device of a memory system, the method comprising:
    receiving a write command including data and data-masking bits associated with the write command on a data interface of the memory device;
    inhibiting writing the data to a memory core of the memory device upon detecting an error with one or more of the data-masking bits, wherein the detecting an error with one or more of the data-masking bits is performed using a comparison block to compare at least two of the data-masking bits received in a burst operation; and
    proceeding with writing the data to the memory core responsive to the data-masking bits when no errors are detected in the data-masking bits.

14. The method of claim 13 further comprising:
    buffering the data and the data-masking bits in a write buffer prior to writing the data to the memory core.

15. The method of claim 13 wherein detecting the error with one or more of the data-masking bits is further performed using error checking logic that detects errors on values received at the data interface.

16. The method of claim 13 wherein the comparison block triggers a gating block to inhibit writing the data to the memory core in response to a mismatch between the compared data-masking bits.

17. The method of claim 13 wherein the comparison block functions as a logical OR-gate to inhibit writing the data to the memory core when any of the compared data-masking bits are asserted.

* * * * *